US005859484A

United States Patent [19]

Mannik et al.

[11] Patent Number: 5,859,484

[45] Date of Patent: Jan. 12, 1999

[54] RADIOISOTOPE-POWERED SEMICONDUCTOR BATTERY

[75] Inventors: Lennart Mannik, Etobicoke; Harry E. Ruda, Downsview; Samuel B. Peralta, Mississauga; Frank Y. Chu, Islington, all of Canada

[73] Assignee: Ontario Hydro

[21] Appl. No.: 565,708

[22] Filed: Nov. 30, 1995

[51] Int. Cl.[6] .............................. G21H 1/00; G21H 1/06; H01L 37/00

[52] U.S. Cl. .............................. 310/303; 136/202

[58] Field of Search .............................. 310/301, 303, 310/305; 136/202, 253; 429/5

[56] References Cited

U.S. PATENT DOCUMENTS

| | | | |
|---|---|---|---|
| 2,745,973 | 5/1956 | Rappaport | 310/303 |
| 2,811,653 | 10/1957 | Moore | 310/303 |
| 2,819,414 | 1/1958 | Sherwood et al. | 310/303 |
| 2,837,666 | 6/1958 | Linder | 310/305 |
| 2,976,433 | 3/1961 | Rappaport et al. | 310/303 |
| 3,094,634 | 6/1963 | Rappaport | 310/303 |
| 3,249,830 | 5/1966 | Adany | 310/301 |
| 3,714,474 | 1/1973 | Hoff, Jr. | 310/303 |
| 4,024,420 | 5/1977 | Anthony et al. | 310/303 |
| 4,628,143 | 12/1986 | Brotz | 310/303 |
| 4,900,368 | 2/1990 | Brotz | 310/303 |
| 5,008,579 | 4/1991 | Conley et al. | 310/303 |
| 5,082,505 | 1/1992 | Cota et al. | 310/303 |
| 5,122,332 | 6/1992 | Russel | 310/301 |
| 5,260,621 | 11/1993 | Little et al. | 310/303 |
| 5,396,141 | 3/1995 | Jantz et al. | 310/303 |

OTHER PUBLICATIONS

Singh, Semiconductor Devices An Introduction, McGraw–Hill Inc., pp. 86–93, Mar. 1994.

"Low Dimensional Physics", Oxford Science Publications, London, pp. 76–101, Sep. 1995.

*Primary Examiner*—Clayton E. LaBalle
*Attorney, Agent, or Firm*—Bereskin & Parr

[57] ABSTRACT

A radioisotope-powered semiconductor battery comprises a substrate of a crystalline semiconductor material, the material having at least one degree of confinement, and a radioactive power source comprising at least one radioactive element. The power source is positioned relative to the substrate to allow for impingement of emitted particles on the substrate. The semiconductor material may be electronically, structurally or chemically confined. The radioactive element is preferably impregnated within or immediately adjacent the semiconductor material.

27 Claims, 3 Drawing Sheets

RADIOISOTOPE-POWERED SEMICONDUCTOR BATTERY

FIELD OF THE INVENTION

The present invention relates to nuclear batteries, and more particularly, to nuclear batteries comprising a substrate of crystalline semiconductor material powered by a radioactive element or isotope.

BACKGROUND OF THE INVENTION

Because of the limited energy storage capacity of conventional electrochemical batteries, there have been various attempts at developing batteries powered by radioactive elements, due to the higher theoretical limits on the energy density from such radioactive elements or radioisotopes. The most common type of nuclear batteries are known as radiothermal generators (RTGs), which utilize the heat produced when the decay energy of the radioactive material is absorbed by the battery material to produce power. Such batteries are commonly used in navigation buoys, weather stations, various space based applications such as satellites, and also for nuclear powered pacemakers. For such applications, the most commonly used radioisotopes are strontium-90 and plutonium-238, although cesium-137 and curium-242 and curium-244 can also be used.

Also known are nuclear batteries which utilize an indirect conversion approach. In such indirect conversion devices, a substrate material impregnated with a radioisotope and a phosphor powder is sandwiched between two photovoltaic cells. The decay particles emitted by the radioisotope excite the phosphors, causing light to be emitted, which is then absorbed by the photovoltaic cells, generating electricity. The potential applications of these devices are limited by the relatively low conversion efficiencies and poor stability of the luminescent material, due to radiation damage.

U.S. Pat. No. 4,024,420 to Anthony et al., describes a further type of nuclear battery, namely a deep diode atomic battery made from a bulk semiconductor crystal powered by gamma rays and x-ray emission from a radioactive source embedded in a central cavity in the interior of the semiconductor crystal. As the radioactive source of this device is stated to be preferably a high energy source, the energetic emission from the radioactive source can lead to radiation damage and heating of the bulk semiconductor crystal, with consequent lowered efficiency and shortened operating lifetime.

U.S. Pat. No. 5,260,621 to Little et al. discloses a further solid state nuclear battery, comprising a relatively high energy radiation source, such as promethium-147, and a bulk crystalline semiconductor which is characterized by defect generation in response to the radioisotope. The materials of the semiconductor are chosen such that the radiation damage is repaired by annealing in real time at the elevated operational temperature of the battery. This device has several shortcomings, due to the inherent inefficiency of the semiconductor used, which necessitates the use of a high energy radiation source. As noted above, such a source can produce severe lattice damage, requiring that the material be self-annealing, to achieve an acceptable carrier lifetime and output. As continuous annealing of the semiconductor is required, the useful life of such a battery is limited.

U.S. Pat. No. 5,396,141 to Jantz et al. discloses a further solid state nuclear battery, which utilizes a radioactive source associated with a p-n junction. In this device, the semiconductor material includes integrated circuitry formed therein. Because of this, physical separation of the nuclear battery from the integrated circuits is required to protect against the effects of thermal degradation and radiation damage, from both chronic radiation exposure and damage due to a single high-energy event, which is of particular concern with the high-energy sources described. Further, because of the physical separation of the battery from the electronic circuits, the potential for miniaturization and incorporation of this device into integrated circuit applications is limited.

SUMMARY OF THE INVENTION

It is an object of the present invention to provide a radioisotope powered semiconductor battery with improved efficiency and radiation hardness, and which may be tailored for a variety of output powers.

It is a further object of the present invention to provide a radioisotope-powered semiconductor battery the operation of which is not radiationally or thermally detrimental to any load to which it may practically be connected.

It is a further object of the present invention to provide a radioisotope-powered semiconductor battery which is suitable for use in photonic, microwave and hybridized optoelectronic applications.

These and other objects of the present invention are accomplished by providing a radioisotope-powered semiconductor battery comprising a substrate of a crystalline semiconductor material, said semiconductor material having at least one degree of confinement, and a radioactive power source comprising at least one radioactive element, the power source positioned relative to the substrate to allow for impingement of particles emitted by the at least one radioactive element on the substrate.

In accordance with a further aspect of the present invention, there is provided a radioisotope powered semiconductor battery comprising a plurality of cells, each of said cells comprising a substrate of semiconductor material having at least one degree of confinement, and at least one radioactive power source, each of said at least one power sources comprising at least one radioactive element, said at least one radioactive power source positioned relative to the cells to allow for impingement of emitted particles on the substrate of the cells, wherein the electrical output of each of the cells is cumulatively combined.

DETAILED DESCRIPTION OF THE PREFERRED EMBODIMENT

Figure 1:
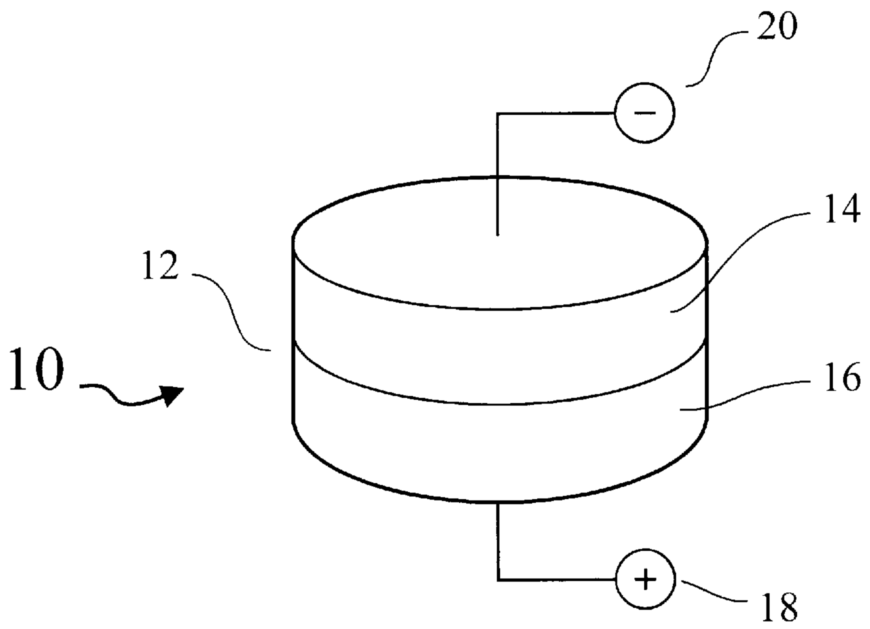
FIG. 1 is a schematic view of a battery according to one embodiment of the present invention.

In accordance with the present invention, a radioisotope powered semiconductor battery comprises a substrate of a crystalline semiconductor material, the semiconductor material having at least one degree of confinement, and a radioactive power source adapted to cause the substrate to produce electrical energy, the power source comprising at least one radioactive element.

In accordance with the present invention, the confinement of the semiconductor material can arise as the result of either electronic, chemical or structural properties of the material. Examples of semiconductor structures that are electronically confined include quantum well structures. Quantum well structures have at least one degree of electronic confinement, as the free carrier wavelength is less than or equal to the de Broglie wavelength. In a quantum well structure having one degree of confinement, carriers confined can only occupy discrete energy states in the direction of confinement, and in the other two directions, the carriers are free to occupy an increasing continuum of energy states. The density of states in the confined direction is segmented (a staircase-type function), in contrast to the density of states in the unconfined directions, which is continuous. The well-defined segmentation of the density of states in the confined direction enables these structures to generate large built-in potentials.

A further example of an electronically confined structure is a quantum wire, in which the carriers are characterized by electronic states quantized in two directions, and in free states in one dimension. Such structure would have two degrees of electronic confinement. Similarly, a quantum box structure would have three degrees of electronic confinement.

As noted above, the confinement of the semiconductor material can arise through structural properties of the semiconductor material. As used herein, a semiconductor is structurally confined where the interfaces of the semiconductor (either the internal or external interfaces, or both) are chosen such that, on average, the mobile carriers recombine at less than their carrier diffusion length. An example of a structurally confined semiconductor is a porous semiconductor material in which the radial dimension of the columns is less than the carrier diffusion length. The carriers introduced to the material are confined in columns which restrict their motion in the cross-sectional plane, allowing freedom of movement along the length of the column. In such a structure, there are two degrees of confinement, but the electronic states are unrestricted (if the columns have a radial dimension greater than the de Broglie wavelength).

Chemical confinement of the carriers can occur by appropriate doing of the semiconductor material. In effect, the dopant sheaths create a potential variation which restricts carrier movement.

Further, the semiconductor material may have a combination of the above confinement mechanisms. For example, a porous semiconductor material in which the radial dimension of the columns is less than the de Broglie wavelength and less than the carrier diffusion length will have four degrees of confinement, two electronic plus two structural.

Batteries of the present invention have many advantages over the prior art, foremost among which is increased efficiency of the battery. With this increased efficiency, either the amount of radioisotope present can be reduced (if a specified lifetime is desired) or a longer lifetime can be achieved (with a specified amount of radioisotope), as compared with batteries of the prior art. Also, this increased efficiency means that, for a given output, a smaller battery can be used, and therefore greater miniaturization is possible.

The semiconductors useful in the present invention include those in which the atoms are chosen from group IV of the periodic table of the elements (designated as Group IV semiconductors herein), groups III and V of the periodic table of the elements (designated as III–V semiconductors herein), or those in which the atoms are from groups II and VI of the periodic table of the elements (designated as II–VI semiconductors herein) and mixtures thereof. Such mixtures are commonly known as alloys. The material may be, for example, crystalline gallium indium arsenide phosphide (c:GaInAsP). With such semiconductor materials, non-radiative recombination can be controlled by passivation of the semiconductor surfaces.

In accordance with the present invention, the electron-hole pairs of the semiconductor material are produced by the impingement of an alpha, beta or gamma decay particle from a radioisotope, such as tritium, promethium-147, americium-241, carbon-14, krypton-85, cesium-137, radium-226 or -228, curium-242 or -244, and mixtures thereof. In accordance with the present invention, the semiconductor material may be exposed to a source containing the radioisotope, such as for the case of tritium, tritium gas, tritiated water or tritium bound within an organic or inorganic matrix. Alternatively, the tritium or other radioisotope may be incorporated into the semiconductor material, by diffusion or occlusion techniques.

For certain applications, it is preferable to use a radioisotope that emits only low energy particles, to minimize degradation of the semiconductor material and to maximize battery lifetime. As used herein, a low energy emitter is one with an energy of less than about 0.2 MeV. Alternatively, it may be desirable to include at least one high energy emitter and at least one low energy emitter.

In batteries of the present invention, the built-in field of the semiconductor material acts to provide a charge separation which, under external load, can provide current.

The preferred structures of the semiconductor of the present invention are p-n homo- or heterojunctions or quantum well structures. Preferably, the semiconductor is a heterostructure. With such structures, doping using magnesium, selenium and tellurium can be used to control carrier diffusion in the semiconductor material.

FIG. 1 shows a first embodiment of the present invention, in which a battery 10 comprises a semiconductor 12 having a first layer 14 having n-type doping and a second layer 16 having p-type doping. The electrical output of the battery 10 is established across a positive terminal 18 and a negative terminal 20. The semiconductor 12 can be a homostructure, in which layers 14 and 16 are of the same material, for example c: GaAs. For such a structure an abrupt doping profile on either side of the junction between layers 14 and 16 maximizes the junction field and the theoretical maximum voltage obtainable from the semiconductor is the band gap potential. For GaAs, the maximum voltage is about 1.42 eV.

The semiconductor could also be a heterostructure, with layers 14 and 16 being constructed of different materials. For such a heterostructure with an abrupt doping profile, the theoretical maximum voltage obtaining is the lower band gap potential plus band-edge discontinuity potentials. In a GaAs/GaInAsP anisotype heterojunction, the maximum voltage is about 1.9 eV.

Alternatively, the semiconductor may have a graded doping profile, increasing or decreasing smoothly toward provided the semiconductor confines the carriers either electronically or structurally the junction. With such a doping profile, a large built-in field is maintained at the junction to maximize carrier collection and efficiency, while at the same time reducing the near surface profiles to avoid excessive Auger and non-radiative losses of carriers produced by the excitation of the radioisotope. In a further alternative, one of the layers may have an undoped region immediately adjacent the junction between the two layers. In a further alternative, at least one of the layers may be homogeneously doped.

If the radioisotope is to be occluded within the semiconductor, an appropriate doping profile can be engineered. For example, this may be accomplished by a controlled diffusion of the radioisotope into the semiconductor material, i.e. by controlling the pressure, temperature or other similar parameters of the principal isotope source when manufacturing the battery. Simultaneous tailoring of the carrier and isotope concentration and profile can also be accomplished to optimize battery characteristics.

If a semiconductor having a quantum well structure is used, the band gap of the semiconductor material can be tuned for efficient use of the radioisotope's energy absorption spectrum, by choosing an appropriate width and height of the quantum well.

Figure 2:
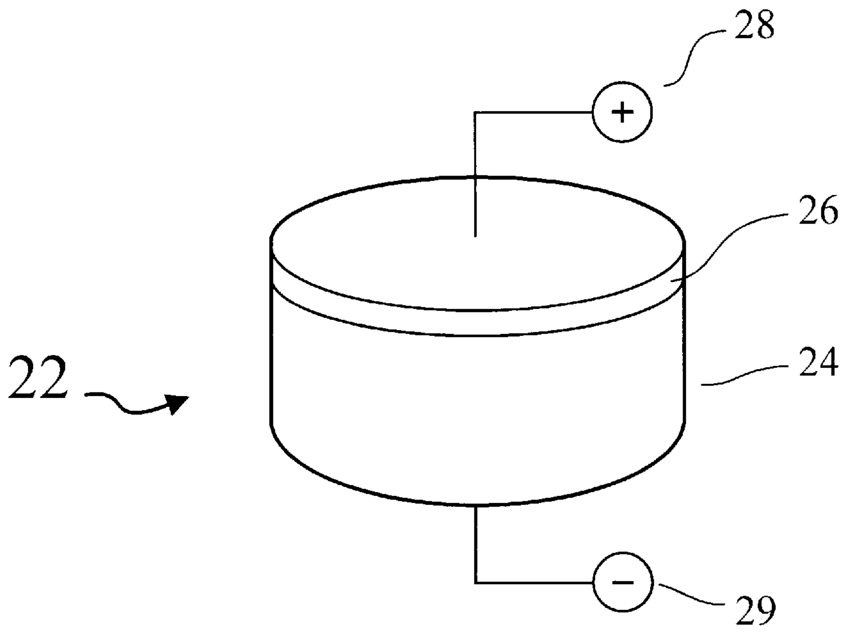
FIG. 2 is a schematic view of a second embodiment of the present invention.

FIG. 2 shows a further embodiment of the present invention, in which a battery 22 comprises a semiconductor 24 having a metal barrier layer 26, of, for example, gold. In this structure, known as a Schottky barrier structure, thermionic field emissions, which result when the carriers gain sufficient energy to overcome the potential barrier at the surface, play a role in the action of the battery. The thickness of barrier layer 26 should be minimized to ensure a good injection efficiency in the battery and to avoid excessive carrier generation in the vicinity of the semiconductor surface, where efficient non-radiative recombination through surface states will degrade the efficiency of the battery. Such problems can be controlled by surface passivation schemes involving chemically adsorbing various species, such as ammonium sulphide, gallium nitride or gallium sulphide, on the surface of the semiconductor 24 prior to applying the barrier layer 26. In the embodiment shown in FIG. 2, the electrical output is established across a positive terminal 28 and a negative terminal 29.

Figure 3:
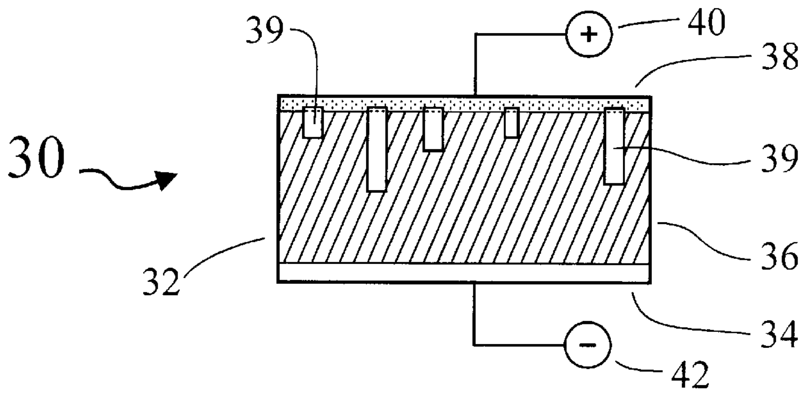
FIG. 3 is a cross sectional view of a further embodiment of the present invention, utilizing precipitated semiconductor materials.

FIG. 3 shows a further embodiment of the present invention in which the battery 30 comprises a semiconductor 32, a positive terminal 40 and a negative terminal 42. The semiconductor 32 comprises a substrate layer 34 of n-type material onto which a layer 36 is grown by low temperature (LT) molecular beam epitaxy (MBE). For example, the layer 34 may be n-GaAs and the layer 36 may be LT-GaAs. With such MBE techniques, high degrees of non-stoichiometry can be achieved, and typically a number of precipitates 39 of the excess atoms results. Since many of the precipitates 39 behave in a metallic fashion, Schottky depletion fields can accompany them. A metallic layer 38 surrounds the LT layer 36 and provides an attachment point for a positive terminal 40. The electrical potential is achieved across the positive terminal 40 and a negative terminal 42 which is attached to substrate layer 34. With such a structure, some of the precipitates 39 are able to contact with the metallic layer 38, while being imbedded in the LT-MBE layer 36. Thus, the battery 30 has a so called metal-insulator-semiconductor (MIS) format, which is highly efficient as a large built-in potential can be developed.

Figure 4:
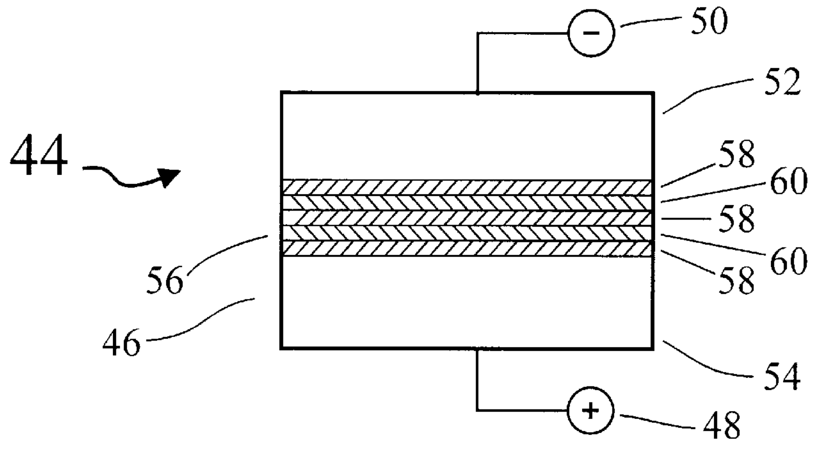
FIG. 4 is a schematic side view of a further embodiment of the present invention having a quantum well superlattice structure.

FIG. 4 shows a further embodiment of the present invention, in which a superlattice structure is utilized. In FIG. 4, a battery 44 comprises a semiconductor 46, a positive terminal 48 and a negative terminal 50. The semiconductor 46 comprises a layer 52 of n-type material to which the negative terminal 50 is attached, a layer 54 of p-type material to which the positive terminal 48 is attached, and an active layer 56 disposed between layers 52 and 54. The layer 56 comprises a plurality of alternating layers 58 and 60 of wide and narrow band gap materials, respectively. In FIG. 4, the active layer 56 is shown as having three layers 58 of wide band gap material, such as GaInAsP, and two layers 60 of narrow band gap material, such as GaAs.

Figure 5:
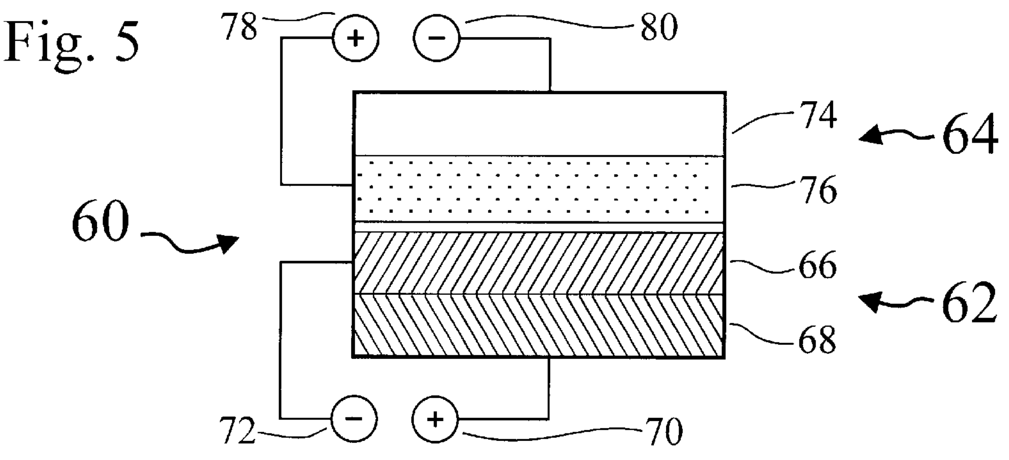
FIG. 5 is a schematic view of a further embodiment of the present invention having a stacked cell configuration.

FIG. 5 shows a further embodiment of the present invention, in which a number of cells containing the semiconductor materials are stacked to form a battery 60. In the embodiment shown, the battery 60 comprises two cells 62 and 64, although any number of cells could be used. Cell 62 comprises a semiconductor having an n-type layer 66 and a p-type layer 68. A positive terminal 70 is connected to the p-type layer 68 and a negative terminal 72 is connected to the n-type layer 66. Similarly, cell 64 comprises an n-type layer 74 and p-type layer 76. A positive terminal 78 is attached to the p-type layer 76 and a negative layer 80 is attached to the n-type layer 74.

If the cells 62, 64 are comprised of the same materials, then with two such cells, a doubling of the output can be achieved. The output of the battery may further be increased by increasing the number of layers.

If the cells 62, 64 are comprised of different materials, each cell can effectively partition the radioisotope's energy spectrum and be chosen to respond most efficiently to a given portion of it. Effectively, cell 62 will absorb a portion of the radioisotope energy spectrum and directly convert it into electrical energy, while the remainder of the isotope energy is transmitted unabsorbed to the second cell 64, which absorbs this energy and directly converts it into electrical energy. Thus, the battery can be optimized, such that one cell responds to the higher energy portion of the radioisotope spectrum and the other cell to the lower energy portion of the radioisotope spectrum.

Figure 6:
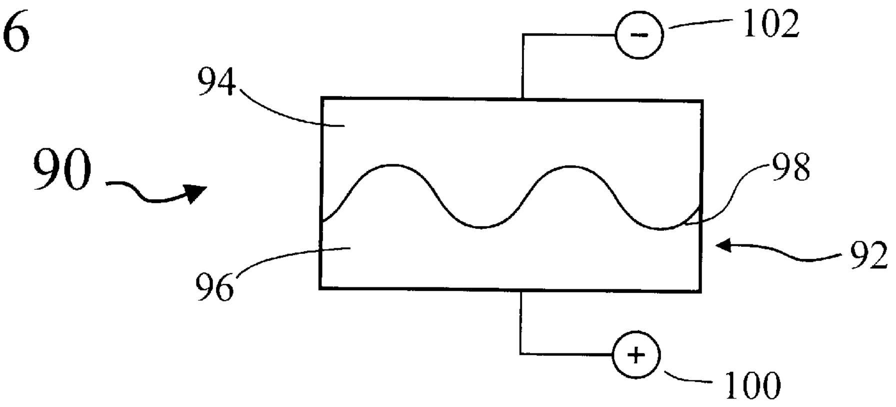
FIG. 6 is a cross-sectional view of a further embodiment of the present invention, in which the semiconductor material has a corrugated structure.

While the embodiments described above include a semiconductor in which both the p-n or other internal junction and the external interfaces between the semiconductor and its surroundings are generally planar, it is also possible to use a semiconductor in which either or both of the p-n or other internal junction or the external interfaces are non-planar. FIG. 6 shows a further embodiment of the present invention, in which a battery 90 comprises a semiconductor 92 have an n-doped layer 94 and a p-doped layer 96. In this embodiment, the p-n junction 98 has a generally corrugated appearance, to enhance the probability that a given carrier produced by the radioisotope is not further than its diffusion length from an active junction. With such a structure, the cell efficiency and output can be maximized for a specified choice of materials and doping profile. As in the other embodiments, a positive terminal 100 and a negative terminal 102 convey the current produced.

Figure 7:
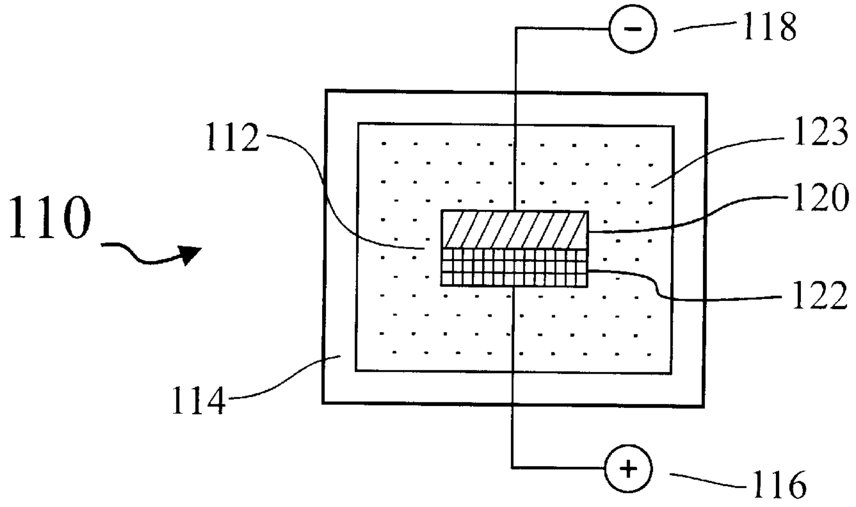
FIG. 7 is a cross-sectional view a further embodiment of the present invention, in which the radioisotope surrounds the semiconductor material.

FIG. 7 shows a further embodiment of the present invention, in which a battery 110 comprises a semiconductor 112, a casing 114, a positive terminal 116 and a negative terminal 118. The semiconductor 112 is disposed within casing 114, and comprises an n-doped layer 120 and a p-doped layer 122. Surrounding the semiconductor 112 within the casing 114 is a layer 123 containing the radioactive source. Layer 123 could be, for example, a solid matrix such a zeolite or a similar porous structure containing the desired radioisotope or isotopes, a thin metal tritide layer, or a liquid or gas containing the radioisotope.

Figure 8:
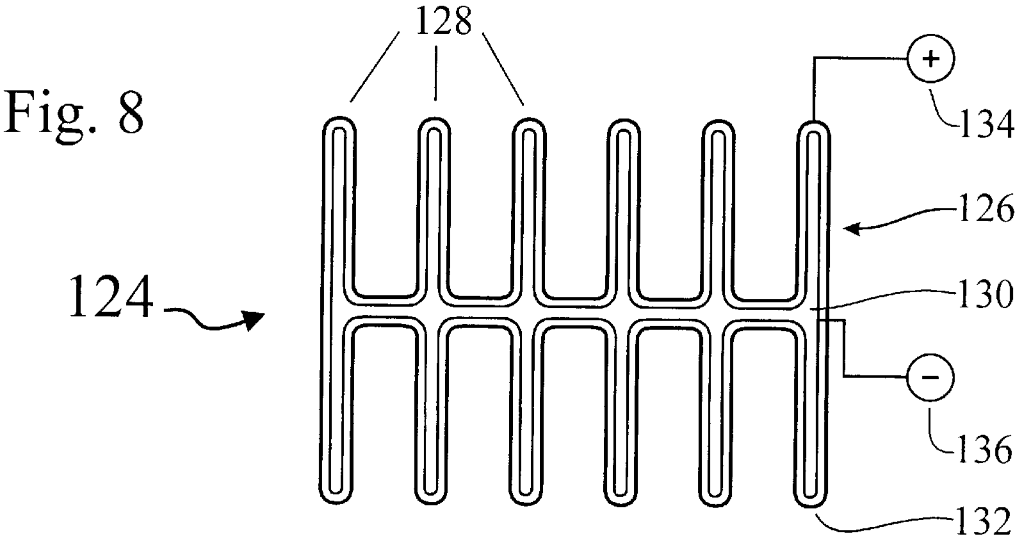
FIG. 8 is a perspective view of a further embodiment of the present invention, wherein the radioisotope is diffused in a porous semiconductor material.

FIG. 8 shows a further embodiment of the present invention, in which a battery 124 comprises a porous semiconductor 126 having a plurality of projections 128. The porous structure of semiconductor 126 may be formed by a variety of processes, such as isotropic or anisotropic etching, groove formation, optical interference and holography, nanostructure lithography or any similar means. In this structure, the semiconductor 126 comprises a central n-doped region 130 surrounded by a p-doped region 132. As with the other embodiments of the present invention, a positive terminal 134 is attached to the p-doped region and negative terminal 136 is attached to the n-doped region. With such a porous structure, there is maximum exposure of the p-n junction to the radioisotope.

By using a mixture of radioisotopes, it is possible to tailor the energy spectrum of the incident particle for the given choice of junction structure, semiconductor material and doping profile to maximize the output of the battery. Similarly, the junction materials may be chosen to respond to the various peaks or energy spectrum regions of the radioisotopes used in the battery.

While batteries according to the present invention will be useful in a variety of applications, they are particularly suited to use in photonic and microwave-based circuits, such as these utilized in digital signal processing, monolithic bipolar devices, lasers, light-emitting diodes, photodetectors, modulators and similar devices.

While the present invention has been described by reference to the above embodiments, such embodiments are merely illustrative of the present invention and are not limiting. Numerous modifications and variations which employ the principals of the present invention will be apparent to those skilled in the art, and all such modifications and variations are within the scope of the invention as defined in the appended claims.

We claim:

1. A radioisotope-powered semiconductor battery comprising:

(a) a substrate of a crystalline semiconductor material, and (b) a radioactive power source comprising at least one radioactive element, said radioactive power source positioned relative to said substrate to allow for impingement of particles emitted by said at least one radioactive element on said substrate, so as to produce mobile carriers in said semiconductor material said radioactive power source providing relatively low energy radiation so as to minimize degradation of the semiconductor material, (c) wherein said semiconductor material has material properties which confine the movement of said mobile carriers within said semiconductor material in at least one direction.

2. A radioisotope-powered semiconductor battery as claimed in claim 1, wherein said radioactive power source is diffused within said substrate.

3. A radioisotope-powered semiconductor battery as claimed in claim 1, wherein said radioactive power source is adjacent said substrate.

4. A radioisotope-powered semiconductor battery as claimed in claim 1, wherein said semiconductor material is selected from the group consisting of III–V and II–VI semiconductor materials and mixtures thereof.

5. A radioisotope-powered semiconductor battery as claimed in claim 4, wherein said semiconductor material comprises a first layer of n-type material, a second layer having a stoichiometric excess of group V or VI atoms, and a third metallic layer, said second layer disposed between and abutting said first and third layers.

6. A radioisotope-powered semiconductor battery as claimed in claim 1, wherein said semiconductor material comprises a first layer and an adjoining second layer.

7. A radioisotope-powered semiconductor battery as claimed in claim 6, wherein said first layer and said second layer are of opposite conductivity.

8. A radioisotope-powered semiconductor battery as claimed in claim 6, wherein at least one of said layers has an undoped region immediately adjacent the interface between said layers.

9. A radioisotope-powered semiconductor battery as claimed in claim 6, wherein at least one of said layers is doped, said doped layer having an abrupt doping profile.

10. A radioisotope-powered semiconductor battery as claimed in claim 6, wherein at least one of said layers is homogeneously doped.

11. A radioisotope-powered semiconductor battery as claimed in claim 6, wherein the composition of said first layer and the composition of said second layer differ.

12. A radioisotope-powered semiconductor battery as claimed in claim 11, wherein one of said layers is a metal.

13. A radioisotope-powered semiconductor battery as claimed in claim 12, wherein said active layer comprises a plurality of alternating layers of a wide and a narrow band gap material.

14. A radioisotope-powered semiconductor battery as claimed in claim 6, wherein the junction of said first layer and said second layer is non-planar.

15. A radioisotope-powered semiconductor battery as claimed in claim 1, wherein said semiconductor comprises a first layer of first conductivity, a second layer of opposite conductivity, and an active layer disposed between said first and second layers.

16. A radioisotope-powered semiconductor battery as claimed in claim 1, wherein said semiconductor material includes a plurality of columnar elements, the diameter of said elements being greater than the wavelength of the free carriers of said material.

17. A radioisotope-powered semiconductor battery as claimed in claim 1, wherein said radioactive power source comprises at least one low energy particle emitter.

18. A radioisotope-powered semiconductor battery as claimed in claim 1, wherein said power source comprises tritium and americium.

19. A radioisotope-powered semiconductor battery as claimed in claim 1, wherein said power radioactive source is at least one low energy particle which emits particles having an energy of less than about 0.2 MeV.

20. A radioisotope-powered semiconductor battery as claimed in claim 1, wherein the semiconductor material has material properties which confine said mobile carriers electronically.

21. A radioisotope-powered semiconductor battery as claimed in claim 20, wherein the semiconductor material has a dimension no greater than the De Broglie wavelength of said mobile carriers.

22. A radioisotope-powered semiconductor battery as claimed in claim 1, wherein the semiconductor material has material properties which confine said mobile carriers chemically.

23. A radioisotope-powered semiconductor battery as claimed in claim 22, wherein the semiconductor material has a junction having an abrupt chemical concentration profile.

24. A radioisotope-powered semiconductor battery as claimed in claim 1, wherein the semiconductor material has material properties which confine said mobile carriers structurally.

25. A radioisotope-powered semiconductor battery as claimed in claim 24, wherein the semiconductor material has a dimension less than the diffusion length of said mobile carriers.

26. A radioisotope-powered semiconductor battery, the battery comprising a plurality of cells, each of said cells comprising a substrate of semiconductor material, and at least one radioactive power source, each of said at least one radioactive power sources comprising at least one radioactive element, said at least one radioactive power source positioned relative to said cells to allow for impingement of particles emitted by said radioactive element on said substrates, so as to produce mobile carriers in each said semiconductor material, each of said at least one radioactive power sources providing relatively low energy radiation so as to minimize degradation of the semiconductor material, wherein each said semiconductor material has material properties which confine the movement of said mobile carriers within said semiconductor material in at least one direction, and wherein the electrical output of each said cells is cumulatively combined.

27. A radioisotope-powered semiconductor battery as claimed in claim 26, wherein the battery comprises an equal number of cells of a first material and of a second material, wherein said first material and said second material differ.

* * * * *